(12) United States Patent
Tokuno

(10) Patent No.: US 7,508,242 B2
(45) Date of Patent: Mar. 24, 2009

(54) DRIVING CIRCUIT THAT ELIMINATES EFFECTS OF AMBIENT TEMPERATURE VARIATIONS AND INCREASES DRIVING CAPACITY

(75) Inventor: Yoshio Tokuno, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/700,835

(22) Filed: Feb. 1, 2007

(65) Prior Publication Data

US 2007/0229124 A1 Oct. 4, 2007

(30) Foreign Application Priority Data

Mar. 31, 2006 (JP) ............................... 2006-098539

(51) Int. Cl.
    *H03K 3/00* (2006.01)
(52) U.S. Cl. ..................... 327/108; 327/112; 326/83
(58) Field of Classification Search ................ 327/108, 327/112; 326/83
    See application file for complete search history.

(56) References Cited

U.S. PATENT DOCUMENTS 4,779,013 A * 10/1988 Tanaka ........................ 326/27
6,066,958 A * 5/2000 Taniguchi et al. ............. 326/27
6,351,149 B1 * 2/2002 Miyabe ........................ 326/87
6,838,906 B2 * 1/2005 Yen .............................. 326/81

FOREIGN PATENT DOCUMENTS

JP 2003-133943 5/2003

* cited by examiner

*Primary Examiner*—Kenneth B. Wells
(74) *Attorney, Agent, or Firm*—Volentine & Whitt, P.L.L.C.

(57) ABSTRACT

In addition to two-stage CMOS inverters inverting and amplifying the input signal, a rising edge detector detects the rising edge of the input signal, and outputs a rising edge detection signal having a pulse width corresponding to ambient temperature, a PMOS drives the output node to the power supply potential according to the rising edge detection signal, a falling edge detector detects the falling edge of the input signal and outputs a falling edge detection signal having a pulse width corresponding to ambient temperature, and an NMOS drives the output node to ground potential according to the falling edge detection signal. When ambient temperature rises, and delay time of the inverters are thereby increased, pulse widths of the rising and falling edge detection signals are increased. The additional driving restrains delay time variation in a driving circuit due to ambient temperature change.

6 Claims, 2 Drawing Sheets

FIG.1
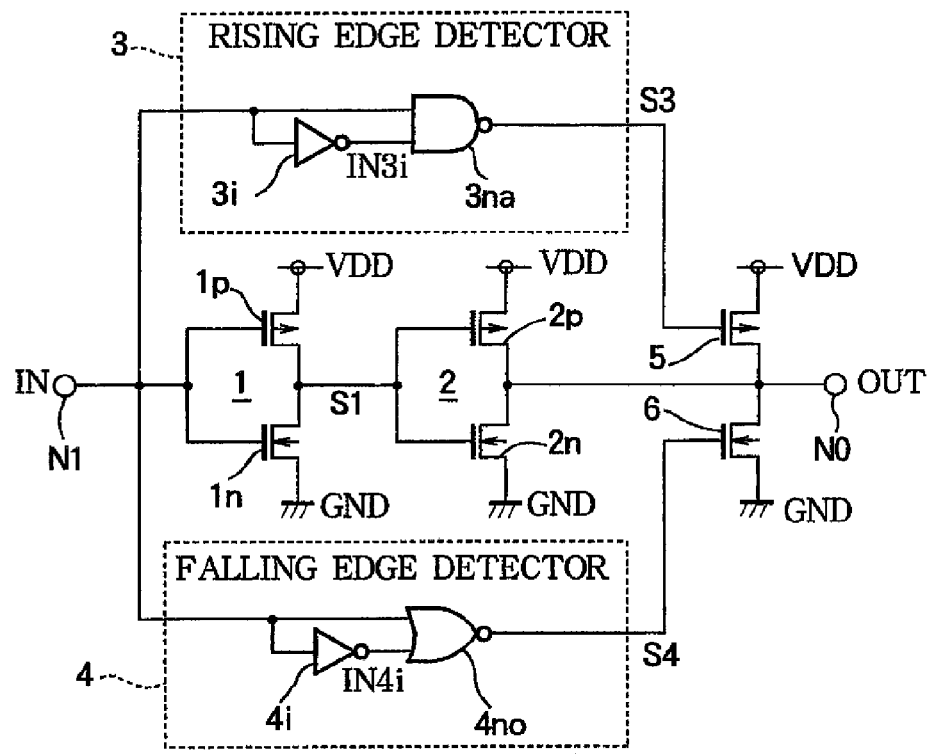
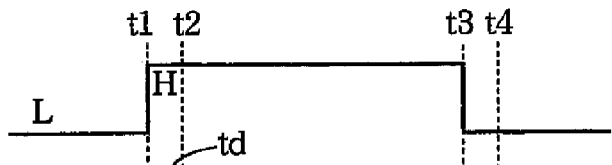
FIG.2A IN
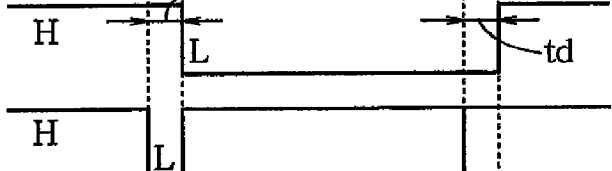
FIG.2B IN3i, IN4i
FIG.2C S3
FIG.2D S4
FIG.2E S1
FIG.2F OUT

FIG.3
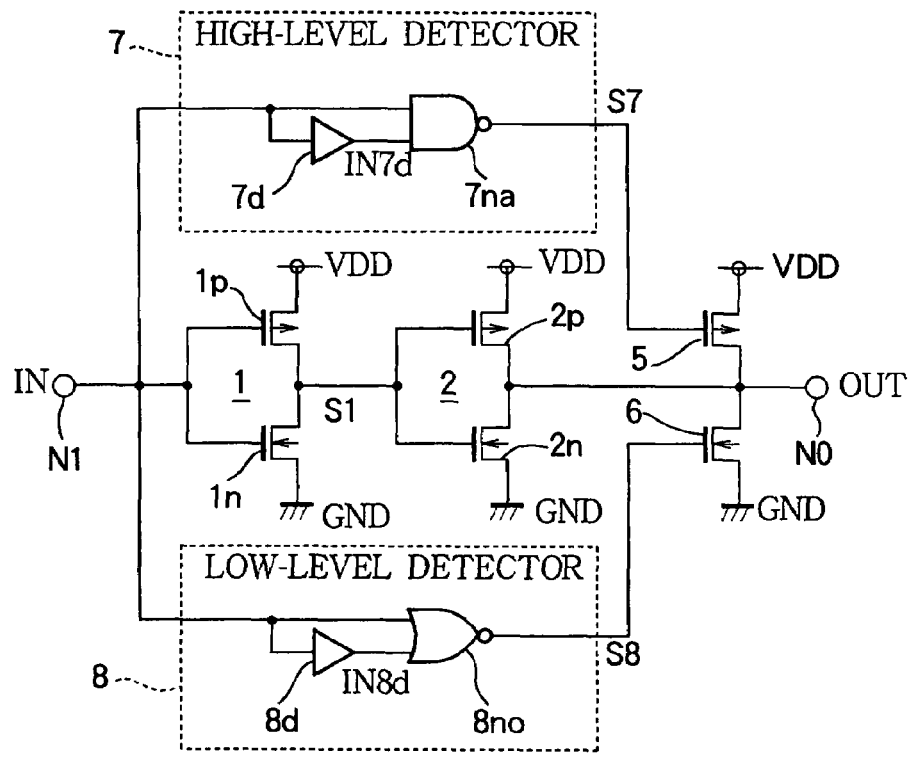
FIG.4A  IN
FIG.4B  IN7d,IN8d
FIG.4C  S7
FIG.4D  S8
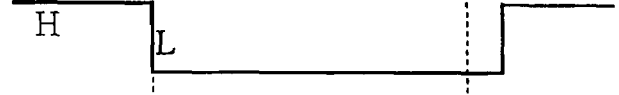
FIG.4E  S1
FIG.4F  OUT
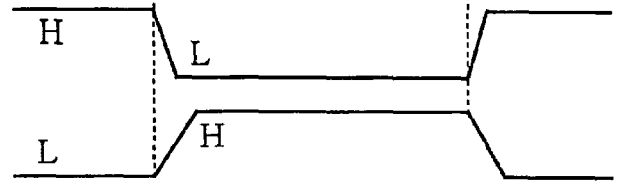

DRIVING CIRCUIT THAT ELIMINATES EFFECTS OF AMBIENT TEMPERATURE VARIATIONS AND INCREASES DRIVING CAPACITY

BACKGROUND OF THE INVENTION

1. Field of the Invention

The present invention relates a driving circuit (driver) provided in an output stage of an LSI (large-scale integrated circuit) for driving a circuit connected externally to the LSI.

2. Description of the Background Art

A conventional circuit provided in an output stage of an LSI to drive a circuit connected to and provided externally to the LSI, comprises a plurality of stages of CMOS inverters, as described for example in Japanese Patent Kokai Publication No. 2003-133943.

The conventional driving circuit having CMOS inverters has the following problems.

(A1) The delay time at each part of the circuit varies with the ambient temperature, causing irregularities with respect to operation timings. In designing an LSI, it was therefore necessary to allow for the variations in the operation timings. However, because of the increase in the size of the LSI, and the miniaturization of each element in the circuit, the variations continue to increase, so that it is becoming more and more difficult to develop an operable LSI unless the variations are restrained. Moreover, the temperature variations are difficult to estimate, and the extent of the temperature variation varies largely with time, so that the effects on the timings are not predictable.

(A2) At the time of the transition of the output signal, a through current flows from the power supply terminal to the ground terminal through a P-channel MOS transistor (hereinafter referred to as "PMOS"), and an N-channel MOS transistor (hereinafter referred to as "NMOS") forming a CMOS, when they are ON (conductive) simultaneously. Such a through current causes waste of power. The through current leads to increase in the consumption current in the LSI as a whole. To cope with the temperature increase, an expensive package may have to be used, resulting in increase in the cost of the product. Moreover, the increased consumption current may be an obstacle in applications to portable equipment.

(A3) Parts of the LSI found to be affected by cross-talk after the layout design need to be modified by changing the wiring of the conductors, and/or changing the position of the driving circuits, to avoid cross-talk. However, such a modification may be difficult depending on the initial layout, and substantial revision of the circuit design or the layout design may be required.

(A4) The driving capacity of the driving section, such as CMOS inverters may not be sufficient for certain applications.

SUMMARY OF THE INVENTION

An object of the invention is to eliminate the effect of the ambient temperature variations.

Another object of the invention is to enlarge the driving capacity.

According to one aspect of the invention, there is provided a driving circuit comprising:

a driving section for power-amplifying an input signal, and outputting an amplified signal to an output node;

an edge detector for detecting a changing edge of the input signal and outputting a detection signal having a pulse width corresponding to the ambient temperature; and a first transistor connected between the output node and a predetermined potential node, and controlled to be conductive according to the detection signal.

The edge detector may be configured to detect a falling edge, as the changing edge, of the input signal and outputs the detection signal; and the predetermined potential node may be a ground potential node.

The edge detector may be configured to detect a rising edge, as the changing edge, of the input signal and outputs the detection signal; and the predetermined potential node may be a power supply potential node.

The edge detector may comprise a rising edge detector and a falling edge detector;

the rising edge detector may be configured to detect a rising edge, as the changing edge, of the input signal and outputs a first detection signal, as the detection signal, having a pulse width corresponding to the ambient temperature;

the falling edge detector may be configured to a falling edge, as the changing edge, of the input signal and outputs a second detection signal, as the detection signal, having a pulse width corresponding to the ambient temperature;

the first transistor may be connected between the output node and a power supply potential node, as the predetermined potential node, and controlled to be conductive according to the first detection signal; and the driving circuit may further comprise a second transistor connected between the output node and a ground potential node, and controlled to be conductive according to the second detection signal.

When the input signal changes (e.g., rises), the output node is driven by the driving section, as well as by the transistor connected between the predetermined potential node, (e.g., the power supply potential node) and the output node. As a result, even when the ambient temperature rises and the delay time of the driving section is increased, because of the additional driving by means of the transistor, the variation in the delay time due to the temperature change can be restrained.

According to another aspect of the invention, there is provided a driving circuit comprising:

a driving section for power-amplifying an input signal, and outputting an amplified signal to an output node;

a level detector for detecting a first changing edge of the input signal, the first changing edge changing in a first direction (one of rising or falling), and outputting a detection signal a certain time interval after the detection, and terminating the output of the detection signal upon detection of a second changing edge of the input signal, the second changing edge changing in a second direction opposite to the first direction; and a first transistor connected between the output node and a predetermined potential node, and controlled to be conductive according to the detection signal.

The level detector may be configured to detect a falling edge, as the first changing edge, of the input signal and outputs a detection signal a certain time interval after the detection, and terminates the output of the detection signal upon detection of the rising edge, as the second changing edge, of the input signal; and the predetermined potential node may be a ground potential node.

The level detector may be configured to detect a rising edge, as the first changing edge, of the input signal and outputs a detection signal a certain time interval after the detection, and terminates the output of the detection signal upon detection of the falling edge, as the second changing edge, of the input signal; and the predetermined potential node may be a power supply potential node.

The level detector may comprise a first level detector and a second level detector;

the first level detector may be configured to detect a rising edge of the input signal and outputs a first detection signal, as the detection signal, a certain time interval after the detection, and terminate the output of the first detection signal upon detection of the falling edge of the input signal;

the second level detector may be configured to detect a falling edge of the input signal and outputs a second detection signal, as the detection signal, a certain time interval after the detection, and terminates the output of the second detection signal upon detection of the rising edge of the input signal;

the first transistor may be connected between the output node and a power supply potential node, as the predetermined potential node, and controlled to be conductive according to the first detection signal; and the driving circuit may further comprise a second transistor connected between the output node and a ground potential node, and controlled to be conductive according to the second detection signal.

By the provision of the transistor connected between the output node and the predetermined potential node (e.g., the power supply potential node), the driving capacity can be increased, and yet the through current through the transistor can be prevented or reduced.

BRIEF DESCRIPTION OF THE DRAWINGS

The invention will be more apparent from the following description in connection with the drawings, in which:

FIG. 1 is a circuit diagram showing a driving circuit of Embodiment 1 of the present invention;

FIGS. 2A to 2F are waveform diagrams showing waveforms of signals appearing at various parts of the circuit of FIG. 1;

FIG. 3 is a circuit diagram showing a driving circuit of Embodiment 2 of the present invention; and FIGS. 4A to 4F are waveform diagrams showing waveforms of signals appearing at various parts of the circuit of FIG. 3.

DETAILED DESCRIPTION OF THE PREFERRED EMBODIMENTS

Embodiment 1

FIG. 1 shows a driving circuit of Embodiment 1 of the present invention.

The illustrated circuit includes an input node NI at which an input signal IN is supplied. Connected to the input node NI is a first CMOS inverter 1 comprising a PMOS 1p and an NMOS 1n connected between a power supply potential node VDD and a ground potential node GND.

Connected to the output side of the CMOS inverter 1 is a second CMOS inverter 2 comprising a PMOS 2p and an NMOS 2n connected between the power supply potential node VDD and the ground potential node GND. The output side of this CMOS inverter 2 is connected to an output node NO, through which the output signal OUT is output. Connected to the input node NI of the driving circuit is a rising edge detector 3 and a falling edge detector 4. The first and the second CMOS inverters 1 and 2 in combination form a driving section for power-amplifying the input signal, and outputting an amplified signal to the output node NO.

A PMOS 5 is connected between the output node NO and the power supply potential node VDD, and an NMOS 6 is connected between the output node NO and the ground potential node GND.

The rising edge detector 3 generates a rising control signal S3 having a pulse width corresponding to the ambient temperature, when the input signal IN rises from the ground potential level "L" to the power supply potential level "H". The pulse width corresponds to the ambient temperature in the sense that the pulse width increases with the increase in the ambient temperature. The rising edge detector 3 comprises an inverter 3i for delaying and inverting the input signal IN, and a NAND gate 3na for outputting the negative logical product (NAND) of the input signal IN, and the signal IN3i output from the inverter 3i, as the rising control signal S3.

The rising control signal S3 is supplied to the gate of the PMOS 5 having its drain and source connected to the output node NO and the power supply potential node VDD.

The falling edge detector 4 generates a falling control signal S4 having a pulse width corresponding to the ambient temperature, when the input signal IN falls from "H" to "L". The falling edge detector 4 comprises an inverter 4i for delaying and inverting the input signal IN, and a NOR gate 4no for outputting the negative logical sum (NOR) of the input signal IN, and the signal IN4i output from the inverter 4i, as the falling control signal S4.

The falling control signal S4 is supplied to the gate of the NMOS 6 having its drain and source connected to the output node NO and the ground potential node GND.

The inverters 3i, 4i are so designed that their delay times are about equal to or slightly longer than the total delay of the cascaded CMOS inverters 1 and 2. In the following description, it is assumed that the delay times of the inverters 3i, 4i are identical to each other.

The operation of the circuit of FIG. 1 will now be described with reference to FIG. 2 which shows waveforms of signals appearing at various parts of the circuit of FIG. 1.

When the input signal IN (FIG. 2A) is at "L" and is stabilized, as in the time period before the time point t1, the rising control signal S3 (FIG. 2C) output from the rising edge detector 3 is at "H", and the falling control signal S4 (FIG. 2D) output from the falling edge detector 4 is at "L". As a result, the PMOS 5 and the NMOS 6 are both OFF (non-conductive). The input signal IN is inverted twice by the cascaded CMOS inverters 1 and 2, so that the output signal OUT (FIG. 2F) is at "L".

At the time t1, the input signal IN (FIG. 2A) rises from "L" to "H". The input signal IN is inverted, with a certain delay time td, by the inverter 3i in the rising edge detector 3, and by the inverter 4i in the falling edge detector 4. At the time t2, upon elapse of the delay time td after the time t1, the signals IN3i, IN4i output from the inverters 3i, 4i fall from "H" to "L" (FIG. 2B). The delay time of an inverter generally has a positive temperature coefficient, and is increased with the increase in the ambient temperature.

During the period from time t1 to time t2, the signal IN3i (FIG. 2B) is at "H", so that the rising control signal S3 (FIG. 2C) output from the NAND gate 3na of the rising edge detector 3 is at "L" for that period. When the signal IN3i goes "L" at the time t2, the rising control signal S3 is returned to "H". Accordingly, the rising control signal S3 rising at the falling edge of the input signal IN, and having a pulse width td corresponding to the ambient temperature is output from the rising edge detector 3, and supplied to the gate of the PMOS 5. The PMOS 5 is thereby ON from the time t1 to the time t2. In this time period, the falling control signal S4 (FIG. 2D) output from the falling edge detector 4 is kept at "L", so that the NMOS 6 is kept OFF.

In the CMOS inverter 1, when the input signal IN rises from "L" to "H", the signal S1 (FIG. 2E) output from the CMOS inverter 1 falls from "H" to "L". The signal S1 is inverted by the CMOS inverter 2, which therefore drives the output signal OUT from "L" to "H". The output signal OUT would have changed as indicated by the dotted line in FIG. 2F, if the rising edge detector 3 and the PMOS 5 were not provided. During this period from the time t1 to the time t2, the power supply potential VDD is supplied to the output node NO through the PMOS 5 which is ON. Accordingly, the output signal OUT is rapidly changed from "L" to "H", as indicated by the solid line in FIG. 2F.

At the time t2, the signal S3 (FIG. 2C) goes "H", and the PMOS 5 is turned OFF, but the output signal OUT at the output node NO is kept at "H" due to the driving by the CMOS inverter 2.

At the time t3, the input signal IN (FIG. 2A) falls from "H" to "L". The input signal IN is inverted, with a certain delay time td, by the inverter 3$i$ in the rising edge detector 3, and by the inverter 4$i$ in the falling edge detector 4. At the time t4, upon elapse of the delay time td after the time t3, the signals IN3$i$, IN4$i$ output from the inverters 3$i$, 4$i$ rise from "L" to "H" (FIG. 2B).

During the period from time t3 to time t4, the signal IN4$i$ (FIG. 2B) is at "L", so that the falling control signal S4 (FIG. 2D) output from the NOR gate 4$no$ of the falling edge detector 4 is at "H" for that period. When the signal IN4$i$ goes "H" at the time t4, the falling control signal S4 is returned to "L". Accordingly, the falling control signal S4 rising with the falling edge of the input signal IN, and having a pulse width td corresponding to the ambient temperature is output from the falling edge detector 4, and supplied to the gate of the NMOS 6. The NMOS 6 is thereby ON from the time t3 to the time t4. In this time period, the rising control signal S3 (FIG. 2C) output from the rising edge detector 3 is kept at "H", and the PMOS 5 is kept OFF.

In the CMOS inverter 1, when the input signal IN falls from "H" to "L", the signal S1 (FIG. 2E) output from the CMOS inverter 1 rises from "L" to "H". The signal S1 is inverted by the CMOS inverter 2, which therefore drives the output signal OUT from "H" to "L". The output signal OUT would have changed as indicated by the dotted line in FIG. 2F, if the falling edge detector 4 and the NMOS 6 were not provided. During this period from the time t3 to the time t4, the ground potential GND is supplied to the output node NO through the NMOS 6 which is ON. Accordingly, the output signal OUT is rapidly changed from "H" to "L", as indicated by the solid line in FIG. 2F.

At the time t4, the signal S4 (FIG. 4D) goes "L", and the NMOS 6 is turned OFF, but the output signal OUT at the output node NO is kept at "L" due to the driving by the CMOS inverter 2.

As has been described, the driving circuit of Embodiment 1 comprises the rising edge detector 3 detecting the rising edge of the input signal IN, and outputting the rising control signal S3 having a pulse width corresponding to the ambient temperature; the falling edge detector 4 detecting the falling edge of the input signal IN, and outputting the falling control signal S4 having a pulse width corresponding to the ambient temperature; the PMOS 5 responsive to the rising control signal S3, for driving the output node NO to the power supply potential VDD; and the NMOS 6 responsive to the falling control signal S4, for driving the output node NO to the ground potential GND. As a result, when the ambient temperature is increased, and the delay times of the CNMOS inverters 1 and 2 are thereby increased due to the reduction in the driving power of the CMOS inverters 1, and 2, the pulse widths of the rising control signal S3 and the falling control signal S4 are also increased. Accordingly, the driving time by the PMOS 5 and the NMOS 6, which serve as auxiliary driving circuits at the time of the transition of the input signal IN is increased. Accordingly, variation in the delay time due to the variation in the ambient temperature can be restrained.

Embodiment 2

FIG. 3 shows a driving circuit according Embodiment 2 of the present invention. Reference numerals identical to those in FIG. 1 denote identical or corresponding elements.

The driving circuit shown in FIG. 3 is provided with a high-level detector 7, serving as a first detector in place of the rising edge detector 3, and a low-level detector 8, serving as a second detector, in place of the falling edge detector 4.

The high-level detector 7 outputs a high-level detection signal S7 which goes "L" upon expiration of a certain time period after the input signal IN rises from "L" to "H". When the input signal IN falls from "H" to "L", the high-level detection signal S7 is returned to "H" instantly. The falling and rising of the high-level detection signal S7 may be described as "commencement" and "termination" of the high-level detection signal S7. The high-level detector 7 comprises a delay element 7$d$ for delaying the input signal IN by a certain time period, and a NAND gate 7$na$ for outputting, as the high-level detection signal S7, the logical NAND of the input signal IN and the signal IN7$d$ output from the delay element 7$d$. The high-level detection signal S8 output from the NAND gate 7$na$ is supplied to the gate of the PMOS 5.

The low-level detector 8 outputs a low-level detection signal S8 which goes "H" upon expiration of a certain time period after the input signal IN falls from "H" to "L". When the input signal IN rises from "L" to "H", the low-level detection signal S8 is returned to "L" instantly. The rising and falling of the low-level detection signal S8 may be described as "commencement" and "termination" of the low-level detection signal S8. The low-level detector 8 comprises a delay element 8$d$ for delaying the input signal IN by a certain time interval, and a NOR gate 8$no$ outputting, as the low-level detection signal S8, the logical NOR of the input signal IN and the signal IN8$d$ output from the delay element 8$d$. The low-level detection signal S8 output from the NOR gate 8$no$ is supplied to the gate of the NMOS 6.

The rest of the configuration is identical to that in FIG. 1.

The operation of the circuit of FIG. 3 will now be described with reference to FIG. 4 which shows waveforms of signals appearing at various parts of the circuit of FIG. 3.

When the input signal IN (FIG. 4A) is at "L" and is stabilized, as in the time period before the time point T1, the high-level detection signal S7 (FIG. 4C) output from the high-level detector 7 and the low-level detection signal S8 (FIG. 4D) output from the low-level detector 8 are both at "H", so that the PMOS 5 is OFF while the NMOS 6 is ON. The input signal IN is inverted twice by the cascaded CMOS inverters 1, 2, so that the output signal OUT (FIG. 4F) is at "L".

At the time T1, the input signal IN (FIG. 4A) rises from "L" to "H". The low-level detection signal S8 (FIG. 4D) output from the low-level detector 8 falls to "L". As a result, the NMOS 6 is turned OFF. In the high-level detector 7, the signal IN7$d$ (FIG. 4B) output from the delay element 7$d$ is kept "L"

for a certain time interval, because of the delay, so that the high-level detection signal S7 is kept at "H", and the PMOS 5 is kept OFF.

The input signal IN is inverted by the CMOS inverter 1, and the signal S1 (FIG. 4E) falls from "H" to "L". The signal S1 is inverted by the CMOS inverter 2, and the output signal OUT is driven to rise from "L" to "H".

At the time T2, i.e., upon expiration of a certain time interval td after the time T1, the signal IN7d output from the delay element 7d in the high-level detector 7, and the signal IN8d output from the delay element 8d in the low-level detector 8 rise from "L" to "H" (FIG. 4B). As a result, the high-level detection signal S7 (FIG. 4C) output from the high-level detector 7 falls to "L", and the PMOS 5 is turned ON. At this time point, the low-level detection signal S8 (FIG. 4D) output from the low-level detector 8 is at "L", and the NMOS 6 is kept OFF. That is, when the input signal IN is at "H" and is stabilized, the high-level detection signal S7 (FIG. 4C) output from the high-level detector 7 and the low-level detection signal S8 (FIG. 4D) output from the low-level detector 8 are both at "L". As a result, the PMOS 5 is ON, and the NMOS 6 is OFF. The input signal IN is inverted twice by the cascaded CMOS inverters 1, 2, so that the output signal OUT is at "H".

At the time T3, the input signal IN (FIG. 4A) falls from "H" to "L". The high-level detection signal S7 (FIG. 4C) output from the high-level detector 7 rises to "H". As a result, the PMOS 5 is turned OFF. In the low-level detector 8, the signal IN8d (FIG. 4B) output from the delay element 8d is kept at "H" for a certain time interval, because of the delay, so that the low-level detection signal S8 is kept at "L", and the NMOS 6 is kept OFF.

The input signal IN is inverted by the CMOS inverter 1, and the signal S1 (FIG. 4E) rises from "L" to "H". The signal S1 is inverted by the CMOS inverter 2, and the output signal OUT is driven to fall from "H" to "L".

At the time T4, i.e., upon expiration of a certain time interval td after the time T3, the signal IN7d output from the delay element 7d in the high-level detector 7, and the signal IN8d output from the delay element 8d in the low-level detector 8 fall from "H" to "L" (FIG. 4B). As a result, the low-level detection signal S8 (FIG. 4D) output from the low-level detector 8 rises to "H", and the NMOS 6 is turned ON. At this time point, the high-level detection signal S7 (FIG. 4C) output from the high-level detector 7 is at "H", and the PMOS 5 is kept OFF Thus, the drive circuit is returned to the state in which the input signal IN is stabilized at "L".

As has been described, the driving circuit of Embodiment 2 comprises the high-level detector 7 for detecting the rising edge of the input signal IN, and outputting the high-level detection signal S7 a certain time interval after the detection of the rising edge of the input signal IN; the low-level detector 8 for detecting the falling edge of the input signal IN, and outputting the low-level detection signal S8 a certain time interval after the detection of the falling edge of the input signal IN; the PMOS 5 responsive to the high-level detection signal S7, for driving the output node NO to the power supply potential VDD; and the NMOS 6 responsive to the low-level detection signal S8, for driving the output node NO to the ground potential GND. As a result, when the level of the input signal IN is not stable during the transition, the PMOS 5 and the NMOS 6 are maintained OFF, and when the level of the input signal IN is stabilized, the driving of the output signal OUT by means of the PMOS 5 or the NMOS 6 is conducted. Accordingly, even when PMOS 5 and NMOS 6 having a large capacity, and having a large driving power are used, they are prevented from being turned ON concurrently, at the time of the transition of the input signal IN, and the through current can be reduced.

The invention is not limited to the embodiments described above, but various modifications are possible. Examples of such modifications are summarized below:

(B1) In the description of Embodiment 1, it is assumed that the delay times of the inverters 3i, 4i are identical. In such a case, a single inverter may be shared by the rising edge detector 3 and the falling edge detector 4, and such a single inverter may be so connected that its output is supplied to both the NAND gate 3na in the rising edge detector 3 and the NOR gate 4no in the falling edge detector 4. Similarly, in the description of Embodiment 2, it is assumed that the delay times of the delay elements 7d, 8d are identical, in such a case, a single delay element may be shared by the high-level detector 7 and the low-level detector 8, and such a single delay element may be so connected that its output is supplied to both the NAND gate 7na in the high-level detector 7 and the NOR gate 8no in the low-level detector 8.

(B2) In the description of Embodiment 1 and Embodiment 2, it is assumed that the delay times of the inverters 3i, 4i are identical, and the delay times of the delay elements 7d, 8d are identical, but the delay times may not be identical with each other. The minimum requirement is that certain delay times are provided.

(B3) In Embodiment 1, the PMOS 5 and the NMOS 6 are described as auxiliary driving elements for assisting the CMOS inverter 2, but the arrangement may be such that that the pulse width of the rising control signal S3 and the falling control signal S4 are enlarged, and the driving capacity of the PMOS 5 and the NMOS 6 are enlarged, so that the PMOS 5 and the NMOS 6 serve as main driving elements. Even with such a modification, the PMOS 5 and the NMOS 6 serving as main driving elements are prevented from being ON at the same time, so that the through current can be reduced.

(B4) In Embodiment 1, the rising edge detector 3 and the falling edge detector 4 are provided, while in Embodiment 2, the high-level detector 7 and the low-level detector 8 are provided. However, where the conditions of the application of the LSI permit, only one of these detectors (one of the rising edge detector 3 and the falling edge detector 4, or one of the high-level detector 7 and the low-level detector 8) may be used. In such a case, only one of the PMOS 5 and NMOS 6 is provided.

Accordingly, the driving circuit according to Embodiment 1 can be generalized as having an edge detector which detects a changing edge of the input signal and outputting a detection signal having a pulse width corresponding to the ambient temperature, and a first transistor connected between the output node and a predetermined potential node, and controlled to be conductive according to the detection signal. The "predetermined potential node" is the power supply potential node VDD when the "first transistor" is the PMOS 5, while the "predetermined potential node" is the ground potential node GND when the "first transistor" is the NMOS 6.

Similarly, the driving circuit according to Embodiment 2 can be generalized as having a level detector for detecting a first changing edge of the input signal, the first changing edge changing in a first direction (one of rising or falling), and outputting a detection signal a certain time interval after the detection, and terminating the output of the detection signal upon detection of a second changing edge of the input signal, the second changing edge changing in a second direction opposite to the first direction, and a first transistor connected between the output node and a predetermined potential node, and controlled to be conductive according to the detection signal. The "predetermined potential node" is the power supply potential node VDD when the "first transistor" is the PMOS 5, while the "predetermined potential node" is the ground potential node GND when the "first transistor" is the NMOS 6.

(B5) In Embodiment 2, the high-level detection signal S7 output from the high-level detector 7 goes "L" upon expiration of a certain time period after the input signal IN rises from "L" to "H", and goes "H" instantly when the input signal IN falls from "H" to "L". Similarly, the low-level detection signal S8 output from the low-level detector 8 goes "H" upon expiration of a certain time period after the input signal IN falls from "H" to "L", and goes "L" instantly when the input signal IN rises from "L" to "H". The specific logical levels which the high-level detection signal S7 and the low-level detection signal S8 assume may be altered. What is required is that the high-level detector 7 detects the rising edge of the input signal, outputs a detection signal a certain time interval after the detection, and terminates the output of the detection signal upon detection of the falling edge of the input signal, and the low-level detector 8 detects the falling edge of the input signal, outputs a detection signal a certain time interval after the detection, and terminates the output of the detection signal upon detection of the rising edge of the input signal. With regard to the high-level detector 7, "outputting a detection signal" corresponds to the lowering to "L" of the high-level detection signal S7 in Embodiment 2, and "terminating the output of the detection signal" corresponds to the raising to "H" of the high-level detection signal S7. With regard to the low-level detector 8, "outputting a detection signal" corresponds to the raising to "H" of the low-level detection signal S8 in Embodiment 2, and "terminating the output of the detection signal" corresponds to the lowering to "L" of the low-level detection signal S8.

What is claimed is:

1. A driving circuit comprising:
   a driving section for buffering an input signal at an input node, and outputting an amplified signal to an output node;
   a rising edge detector for detecting a rising edge of the input signal and outputting a first detection signal having a pulse width corresponding to ambient temperature; and
   a first transistor connected between the output node and a power supply potential node, and controlled to be conductive according to the first detection signal,
   wherein said driving section comprises a first inverter receiving the input signal at the input node, and a second inverter receiving an output of the first inverter and having an output connected to the out node, and
   said rising edge detector comprises a third inverter receiving the input signal at the input node, and a NAND gate having one input receiving the input signal at the input node, having another input receiving an output of the third inverter and having an output connected to a gate of the first transistor.

2. The driving circuit according to claim 1, further comprising:
   a falling edge detector for detecting a falling edge of the input signal and outputting a second detection signal having a pulse width corresponding to the ambient temperature; and
   a second transistor connected between the output node and a ground potential node, and controlled to be conductive according to the second detection signal,
   wherein said falling edge detector comprises a fourth inverter receiving the input signal at the input node, and a NOR gate having one input receiving the input signal at the input node, having another input receiving an output of the fourth inverter and having an output connected to a gate of the second transistor.

3. A driving circuit comprising:
   a driving section buffering an input signal at an input node, and outputting an amplified signal to an output node;
   a first level detector for detecting a rising edge and a falling edge of the input signal and outputting a first detection signal which changes to one logic state a certain time interval after the detection of the rising edge of the input signal and changes to another logic state upon detection of the falling edge of the input signal; and
   a first transistor connected between the output node and a power supply potential node, and controlled to be conductive according to the first detection signal,
   wherein said driving section comprises a first inverter receiving the input signal at the input node, and a second inverter receiving an output of the first inverter and having an output connected to the output node, and
   said first level detector comprises a first delay element receiving the input signal at the input node, and a NAND gate having one input receiving the input signal at the input node, having another input receiving an output of the first delay element and having an output connected to a gate of the first transistor.

4. The driving circuit according to claim 3, further comprising:
   a second level detector for detecting the falling edge and the rising edge of the input signal and outputting a second detection signal which changes to one logic state a certain time interval after the detection of the falling edge of the input signal and changes to another logic state upon detection of the rising edge of the input signal; and
   a second transistor connected between the output node and a ground potential node, and controlled to be conductive according to the second detection signal,
   wherein said second level detector comprises a second delay element receiving the input signal at the input node, and a NOR gate having one input receiving the input signal at the input node, having another input receiving an output of the second delay element and having an output connected to a gate of the second transistor.

5. A driving circuit comprising:
   a first inverter receiving an input signal at an input node, and including a first P-channel MOS transistor and a first N-channel MOS transistor both connected between a power supply potential node and a ground potential node;
   a second inverter receiving an output of the first inverter, having an output connected to an output node, and including a second P-channel MOS transistor and a second N-channel MOS transistor both connected between the power supply potential node and the ground potential node;
   a third P-channel MOS transistor connected between the output node and the power supply potential node;
   a third N-channel MOS transistor connected between the output node and the ground potential node;

a rising edge detector for detecting a rising edge of the input signal, and outputting a first detection signal which falls upon detection of the rising edge of the input signal and rises a first certain time interval after the rising edge of the input signal, said first certain time interval corresponding to ambient temperature; and a falling edge detector for detecting a falling edge of the input signal, and outputting a second detection signal which rises upon detection of the falling edge of the input signal and falls a second certain time interval after the falling edge of the input signal, said second certain time interval corresponding to ambient temperature, wherein said third P-channel MOS transistor is conductive when the first detection signal is low, said third N-channel MOS transistor is conductive when the second detection signal is high, said rising edge detector comprises a third inverter receiving the input signal at the input node, and a NAND gate having one input receiving the input signal at the input node, having another input receiving an output of the third inverter and having an output connected to a gate of the third P-channel MOS transistor, and said falling edge detector comprises a fourth inverter receiving the input signal at the input node, and a NOR gate having one input receiving the input signal at the input node, having another input receiving an output of the fourth inverter and having an output connected to a gate of the third N-channel MOS transistor.

6. A driving circuit comprising:

a first inverter receiving an input signal at an input node, and including a first P-channel MOS transistor and a first N-channel MOS transistor connected between a power supply potential node and a ground potential node;

a second inverter receiving an output of the first inverter, having an output connected to an output node, and including a second P-channel MOS transistor and a second N-channel MOS transistor both connected between the power supply potential node and the ground potential node;

a third P-channel MOS transistor connected between the output node and the power supply potential node;

a third N-channel MOS transistor connected between the output node and the ground potential node;

a first level detector for detecting a rising edge and a tailing edge of the input signal, and outputting a first detection signal which rises a first certain time interval after the detection of the rising edge of the input signal and falls upon detection of the falling edge of the input signal; and a second level detector for detecting a falling edge and a rising edge of the input signal, and outputting a second detection signal which falls a second certain time interval after the detection of the rising edge of the input signal and rises upon detection of the falling edge of the input signal, wherein said third P-channel MOS transistor is conductive when the first detection signal is low, said third N-channel MOS transistor is conductive when the second detection signal is high, said first level detector comprises a first delay element receiving the input signal at the input node, and a NAND gate having one input receiving the input signal at the input node, having another input receiving an output of the first delay element and having an output connected to a gate of the third P-channel MOS transistor, and said second level detector comprises a second delay element receiving the input signal at the input node, and a NOR gate having one input receiving the input signal at the input node, having another input receiving an output of the second delay element and having an output connected to a gate of the third N-channel MOS transistor.

* * * * *